United States Patent [19]

Shii et al.

[11] Patent Number: 4,494,000
[45] Date of Patent: Jan. 15, 1985

[54] IMAGE DISTORTION-FREE, IMAGE ROTATION-FREE ELECTRON MICROSCOPE

[75] Inventors: Kazuo Shii, Ibaraki; Hiroyuki Kobayashi, Katsuta; Morioki Kubozoe, Katsuta; Shigeto Isakozawa, Katsuta, all of Japan

[73] Assignee: Hitachi, Ltd., Tokyo, Japan

[21] Appl. No.: 393,332

[22] Filed: Jun. 29, 1982

[30] Foreign Application Priority Data

Jul. 1, 1981 [JP] Japan .................................. 56-101195

[51] Int. Cl.$^3$ ............................................. G01N 23/00
[52] U.S. Cl. ................................. 250/311; 250/396 R; 250/396 ML
[58] Field of Search ............ 250/311, 396 R, 396 ML; 313/361

[56] References Cited

U.S. PATENT DOCUMENTS

| | | | |
|---|---|---|---|
| 2,418,349 | 4/1947 | Hillier et al. | 250/396 ML |
| 3,715,582 | 2/1973 | Akahori et al. | 250/311 |
| 3,746,855 | 7/1973 | Hilditch | 250/396 R |
| 3,851,172 | 11/1974 | Ozasa | 250/311 |

Primary Examiner—Bruce C. Anderson
Attorney, Agent, or Firm—Antonelli, Terry & Wands

[57] ABSTRACT

A transmission electron microscope comprises an imaging electron lens system constituted in at least five stages by an objective lens, a group of intermediate lenses and a group of projector lenses to which excitation currents are applied with alternately different polarities. Lens current control means is provided for controlling the excitation currents in such a manner that the lenses belonging to the intermediate lens group and the projector lens group, respectively, serve as reduction lens when the microscope is operated in a predetermined range of low magnifications, while all the electron lenses serve as magnifying lenses in a predetermined range of high magnitudes. When the magnification is changed over, the lens current control means regulates the excitation currents in such a manner that the difference between the excitation currents supplied to the intermediate lens group and the projector lens group, respectively, is maintained substantially constant.

21 Claims, 5 Drawing Figures

IMAGE DISTORTION-FREE, IMAGE ROTATION-FREE ELECTRON MICROSCOPE

The present invention generally relates to an electron microscope. In particular, the invention is directed to a transmission electron microscope incorporating an imaging lens system of a novel and improved structure.

In contrast to a glass lens employed in light microscopes, the focal length of an electron lens of the type used in an electron microscope can be varied by varying the excitation current of the electron lens. Under such circumstances, there is widely used a transmission electron microscope incorporating an electromagnetic imaging system in which magnification can be varied with positional relationships among the lenses being maintained fixedly. However, when the excitation current flowing through a coil constituting the electron lens is varied to change the magnification, the electron beam falling on the electron lens undergoes a corresponding rotation in dependence on the variation in the coil current. In other words, the variation in the magnification is accompanied by a rotation of image of the specimen, which causes an inconvenience. Further, among the problems of the hitherto known transmission electron microscopes, inversion of the image can be mentioned which is brought about when the magnification is changed in a certain range of a certain magnification, which of course depends on the actual specification and design of the microscope. It is generally acknowledged that such rotation and inversion of the specimen image occurring upon changing the magnification provide inconveniences to observers. For example, suppose that a field of view of a specimen is selected by moving the specimen only a little bit. In that case, the direction in which the specimen is displaced varies in dependence on magnification. For example, when a specimen image is to be observed at a given magnification in the leftward direction with respect to the image, then the specimen must be displaced or fed by small bits toward the observer. Further when the magnification is changed over to another one the specimen will have to be displaced to the right. Moreover, when a diffraction pattern is desired in addition to the specimen image, difficulty is encountered in associating the diffraction pattern to the corresponding specimen image being rotated. Besides, there is another problem that proper alignment of a specimen image with a rectangular view field of a photographic camera in a desired direction is difficult to be achieved.

Besides, image distortions provide important factors to be properly considered in designing the imaging lens system. Such distortions are ascribable to the fact that the focal length of the electron lens at the center thereof differs from the focal length at a peripheral portion of the lens. Although the problem of the image distortion may be neglected in the case of observation at a high magnification because then only the center portion of the electron lens is made use of, it can no more be put out of consideration for the observation at a low magnification.

Recently, there is a general tendency toward implementation of the imaging lens system in four stages of the electron lenses. Among them the objective lens requires much intensified excitation and exhibits a magnifying factor about twice as high as those of the other lenses. Further, the excitation current for the objective lens is scarcely varied so that aberrations thereof remain constant. It is certainly possible to obviate the image deformations even at a low magnification by selecting appropriately the excitation currents of the other three electron lenses. However, it is extremely difficult to realize a compatible imaging lens system in which neither rotation nor inversion of the image occurs. In reality, it has been impossible to attain such compatibility in the hitherto known lens system constituted by four or less stages of the electron lenses.

There have been attemped various approaches for preventing occurrence of the image rotation. However, the inventors know no electron microscope in which the problem of the image rotation is in reality satisfactorily solved. As a typical example of the hitherto known electron microscopes of this category, there can be mentioned "Hitachi H-600 Electron Microscope" manufactured by the present assignee.

An object of the present invention is to provide an electron microscope incorporating an imaging lens system which scarcely suffers both rotation and inversion of the image and in which rotation of image scarecely occurs even when the magnification is changed.

Another object of the present invention is to provide an electron microscope incorporating an imaging lens system in which substantially no inversion of the image occurs upon changing-over of the magnification from a range of low magnifications to a range of high magnifications.

There is provided according to a basic feature of the invention an electron microscope comprising an imaging lens system of at least five stages in which first, second and third electron lens groups are arrayed linearly with alternately different polarities in this order as viewed from the side of an electron gun. Excitation currents applied to coils constituting the electron lenses, respectively, are so controlled that at least one of the lenses belonging to the second and the third electron lens groups, respectively, serve as a reduction optic system at a low magnification while all the electron lens groups are caused to function as a magnifying optic system at a high magnification. When magnification is to be changed over, the excitation currents supplied to the lens coils, respectively, are so regulated that the difference between the lens currents supplied to the second and the third electron lens groups is maintained constant.

The above and other objects, features and advantages of the present invention will be more apparent from the description of preferred embodiments thereof taken in conjunction with the accompanying drawings in which.

Now, the invention will be described more fully in conjunction with preferred embodiments thereof by referring to the accompanying drawings.

Figure 1:
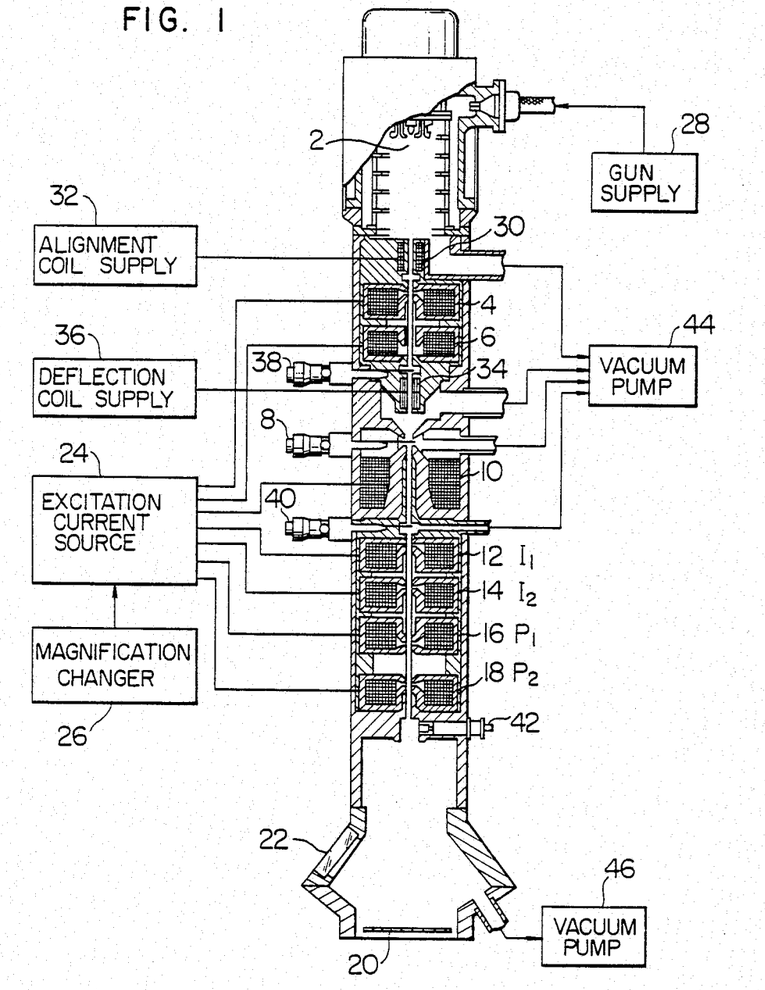
FIG. 1 shows in a partially sectioned elevational view a transmission electron microscope according to an embodiment of the invention.

FIG. 1 shows in an elevational view a transmission electron microscope according to an exemplary embodiment of the invention, wherein the column structure of the electron microscope is shown in a partial sectional view. The electron beam emitted from an electron gun 2 is focussed through a first condenser lens 4 and a second condenser lens 6 to illuminate a specimen held by a specimen holder 8. The image of the specimen is first greatly magnified by an objective lens 10. The magnified image is further magnified by a first intermediate lens 12 and a second intermediate lens 14. Finally, the image is focussed on a fluorescent screen 20 through a first projector lens 16 and a second projector lens 18 while being magnified. The magnified image focussed on the screen 20 can be observed through a view window 22 or can be photographically recorded by a camera (not shown) disposed below the fluorescent screen 20.

Excitation currents supplied to excitation coils constituting the condenser lenses 4 and 6, the objective lens 10, the intermediate lenses 12 and 14 and the projector lenses 16 and 18, respectively, are controlled by an excitation current control unit 24 which incorporates a control circuit and excitation current supply sources, as will be described hereinafter. The coil excitation currents of the various lenses are previously set in association with pre-selected magnifications and stored in the excitation current control unit 24, whereby the excitation currents for the various lenses are controlled in accordance with change-over signals issued by a magnification changer 26. The center of the excitation control unit 24 may be constituted by a computer including a CPU (central processing unit), ROM (read-only memory), RAM (random across memory) and an operation console. In that case, control programs of great versatility may be made use of. The illustrated embodiment of the invention is characterized in that the five-stage imaging lens system including the objective lens 10, the intermediate lenses 12 and 14 and the projector lenses 16 and 18 is employed and that the lens coil currents supplied to these lens stages are controlled by the excitation current control unit 24 in dependence on the desired or selected magnification, as will hereinafter be described in detail.

The electron gun 2 is composed of a tungsten filament of $LaB_6$-filament. Heating of the filament and regulation of the beam intensity are performed by an electron gun power supply source 28. There is disposed between the electron gun 2 and the first condenser coil 4 an alignment coil 30 of which excitation current supplied from an alignment coil current supply 32 is regulated to align the electron beam emitted from the electron gun with the electro-optical axis of the condenser lens system. Disposed above the objective lens 10 is a deflection coil 34 which serves to align the electron beam passed through the condenser lens system with the axis of the imaging lens system by correspondingly controlling the excitation current supplied thereto from a deflection coil current supply source 36. Several apertures are disposed in the path of the electron beam to variably restrict the beam diameter thereof. For example, a movable aperture 38 disposed below the second condenser lens 6 and a view field restricting aperture 40 disposed above the first intermediate lens 12 are seen in FIG. 1. Further, a movable aperture for the objective lens 10 is disposed above it, although not shown in the figure. The lens column including the electron gun and the lens system mentioned above is so arranged that it can be shut off from the view chamber and the camera chamber, whereby the interior of the lens column containing the electron gun and the lens system can be exhausted or evacuated by means of a first vacuum pump system 44 including a diffusion pump and a rotary pump, while the view chamber and the camera chamber can be evacuated through a second vacuum pump system 46 of a structure similar to the first pump system 44.

Next, imaging conditions of the five-stage imaging lens system including the objective lens 10, the intermediate lenses 12 and 14 and the projector lenses 16 and 18 will be described by referring to FIGS. 2 and 3. Further, the lens currents set and controlled in dependence on selected magnification by the excitation current control unit 24 in accordance with the basic concept of the invention will be elucidated, only by way of example, by referring to FIG. 4. In this connection, it should be noted that the values of the various lens currents in practical applications may differ from those shown in FIG. 4 in dependence on the configuration of the objective lens, the intensities of excitations (inter-lens spaces) and the like factors.

Figure 2:
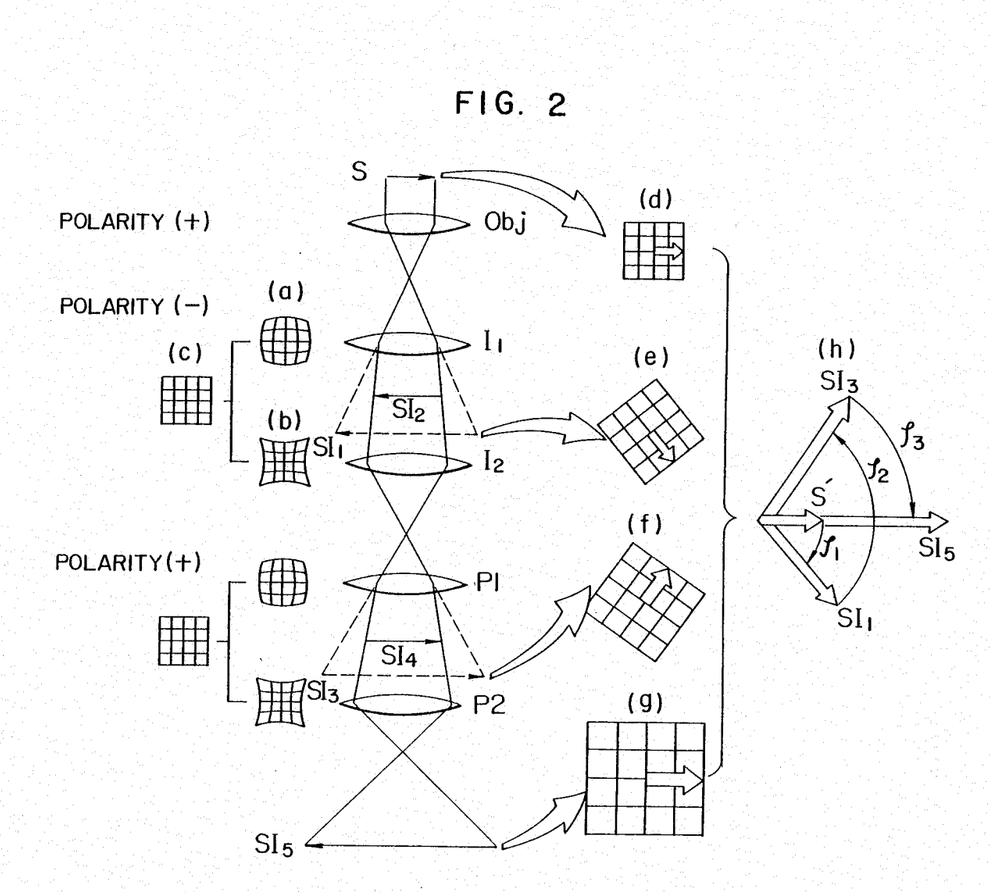
FIGS. 2 and 3 illustrate the principle of the invention embodied in an imaging lens system of the electron microscope shown in FIG. 1.
Figure 3:
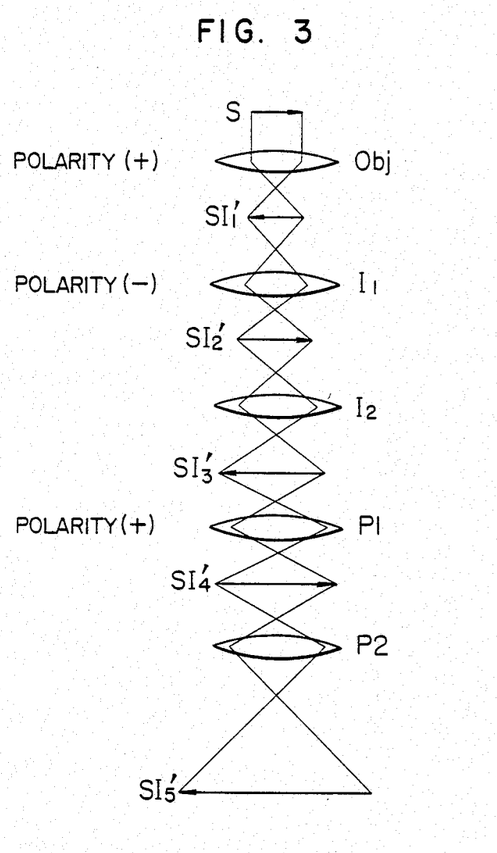

FIG. 2 shows a focussing state of the five-stage imaging lens system operating at a low magnification, while FIG. 3 shows a focussing state of the five-stage imaging lens system at a high magnification. In these figures, a reference symbol Obj represents the objective lens, I1 represents the first intermediate lens, I2 the second intermediate lens, P1 the first projector lens and P2 represents the second projector lens.

Referring to FIG. 2, the five-stage imaging lens system is functionally divided into three groups. The first group consists of the objective lens Obj which is constituted by an electromagnetic electron lens coil of about 2000 turns and which exhibits usually extremely small aberrations, suffering scarcely image distortions. The second group is composed of the first intermediate lens I1 and the second intermediate lens I2 in pair, each of which is constituted by an electromagnetic electron lens coil of about 1500 turns. The third group consists of a pair of the first and the second projection lenses P1 and P2, each of which is also constituted by an electromagnetic electron lens coil of about 1500 turns.

In the first place, description will be made of the correction of the image distortions produced in the imaging lens system. Since the objective lens Obj produces substantially no appreciable image distortions as described above, it is only necessary to correct the image distortions in a whole lens subsystem consisting of the second and third lens groups. There are an innumerable number of combinations of the lens excitation currents which permit correction of the image distortions in the whole lens subsystem. A characteristic aspect of the invention resides in that the lens excitation currents for correcting the image distortion are set for every lens group, i.e. at each of the second and the third groups, with a view to evading rotation and inversion of the image, as will hereinafter be made clearer. First, the second group consisting of the first and the second intermediate lenses I1 and I2 are considered. The first intermediate lens I1 is so designed that barrel distortion is produced at a low magnification, as is illustrated in FIG. 2 at (a). On the other hand, there is produced a pincushion distortion in the second intermediate lens I2, as is shown in FIG. 2 at (b). The appearance of the pincushion distortion is explained by the fact that the magnification increases, as the distance between the optical axis and a point of the object to be imaged is increased. Accordingly, the barrel distortion of the first intermediate lens I1 can be cancelled out by the pincushion distortion of the second intermediate lens, resulting in no distortion appearing in the second lens group as a whole, as is illustrated at (c) in FIG. 2. The mechanism in which the barrel distortion and the pincushion distortion take place is well known in the art. For example, reference may be made to Ceil E. Hall's "Introduction to Electron Microscopy", McGraw-Hill, 1953, p. 119. In a conventional magnifying optical system, the pincushion distortion usually occurs. However, since a first image SI1 of the specimen S focussed by the objective lens Obj is formed on a plane lying between the first intermediate lens I1 and the second intermediate lens I2, the first intermediate lens I1 is so designed that the barrel distortion does occur. A specimen image SI3 formed by the second intermediate lens I2 falls on a plane located between the first and the second projector lenses P1 and P2 both belonging to the third group. Accordingly, by designing also the first and the second projector lenses P1 and P2 so that the barrel distortion and the pincushion distortion occur in these lenses, respectively, it is possible to make no distortions occur in the third lens group as a whole.

In this way, image distortions can be suppressed at the objective lens, the paired intermediate lenses and the paired projector lenses, respectively, when a low magnification is selected, which in turn means that no distortion occurs in the whole five-stage imaging lens system.

Figure 4:
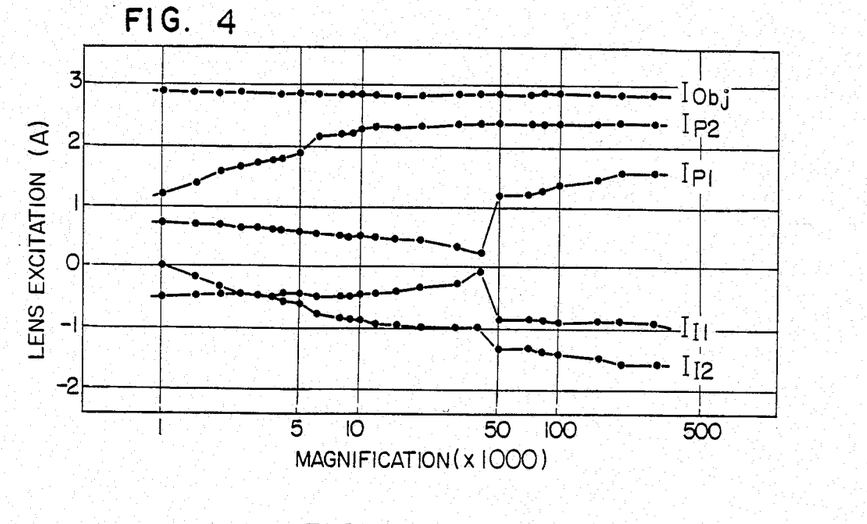
FIG. 4 graphically shows variations in lens excitation currents supplied to the lens coils of the imaging lens system illustrated in FIGS. 2 and 3.

Magnification in a range lower than several thousands is usually referred to as the low magnification range. Variations in the excitation currents for the various lenses which are brought about when the magnification is changed over from one to another in the low magnification range are plotted in FIG. 4. In this figure, $I_{I1}$ represents the excitation current of the first intermediate lens I1. As will be seen in FIG. 4, the absolute magnitude of the excitation current $I_{I1}$ decreases, as the magnification is increased in the small or low magnification range. Since the focal length varies inversely as the square of the lens current $I_{I1}$ the focal length is increased, when the lens current $I_{I1}$ is decreased. Accordingly, the barrel distortion becomes smaller, as the magnification is increased. On the other hand, the absolute value of the excitation current $I_{I2}$ for the second intermediate lens I1 increases with the increase of the magnification. Magnification of the intermediate lens I2 is increased with the pincushion distortion being reduced, as the focal length is decreased. For these reasons, total distortion can be compensated while increasing the magnification, by varying the lens excitation currents $I_{I1}$ and $I_{I2}$ in the relation shown in FIG. 4. The same holds true for the excitation currents $I_{P1}$ and $I_{P2}$ of the projector lenses P1 and P2. These current values are set in the range from $-2A$ to $3A$ as shown in FIG. 4.

Next, compensation for rotation of the image will be elucidated.

Referring to FIG. 2, it is assumed that the objective lens Obj is of positive (+) polarity, while the polarity of the intermediate lenses I1 and I2 constituting the second lens group is assumed to be negative (−) so that the excitation current flows through the intermediate lenses in the direction opposite to that of the excitation current flowing in the objective lens Obj. Further, the projector lenses P1 and P2 of the third lens group are of positive (+) polarity. In other words, the polarity of the three lens groups is alternated from one to another group along the beam path as viewed from the electron beam source.

Rotation of the image at each of the lens groups will first be considered. It is again assumed that a specimen S is of a squarely sectioned structure without distortion and disposed in a direction indicated by a hollow arrow, as shown at (d) in FIG. 2. An electron beam transmitted through this specimen S is focussed as a specimen image SI1 by the objective lens Obj. Although the image SI1 is also of a squarely sectioned pattern without distortion like the one shown at (d) in FIG. 4 for the reason described above, the image SI1 is rotated in a plane perpendicular to the beam path, as shown at (e) in FIG. 2. Angle of the rotation relative to the original orientation or direction of the specimen is represented by $\phi 1$, as illustrated at (h) in FIG. 2. When the specimen S is oriented to the right as indicated by an arrow S', the specimen image SI1 formed by the objective lens Obj is inverted so as to be oriented toward the left (counterclockwise) because the objective lens is a magnifying element. In other words, the specimen image undergoes both rotation and inversion in the case of the electron lens. In this connection, it should be noted that inversion of the image is omitted from illustrations (e) to (g) of FIG. 2 for the sake of simplification. Now, the specimen image SI1 is formed into a specimen image SI3 by means of the intermediate lenses I1 and I2. This image SI3 is further rotated as shown at (f) in FIG. 2. However, the direction of rotation of the image SI3 is opposite to the direction in which the image SI1 has been rotated, as is indicated by respective solid arrows at (h) in FIG. 4. This is because the polarity of the second group lenses I1 and I2 is opposite to that of the objective lens Obj. The angle of rotation of the specimen image SI3 is represented by $\phi 2$ (FIG. 4, h). Finally, the specimen image SI3 is projected on the fluorescent screen as a specimen image SI5. This image SI5 is further rotated from the image SI3 as shown at (g) in the direction opposite to the rotational direction of the specimen image SI3 as shown at (h) in FIG. 2. The rotation of the final specimen image SI5 projected onto the fluorescent screen relative to the orientation of the specimen S is determined by the sum of the rotation angles imparted, respectively, by the first to third lens groups, which sum is given by $(\phi 1 - \phi 2 + \phi 3)$. In this connection, the value of the angle $\phi 1$ may be regarded as a constant, since the excitation current for the objective lens is scarcely subjected to variations. The angles of rotation brought about by the individual lenses are in proportion to the excitation currents supplied to them. Accordingly, when the excitation currents for the intermediate lenses I1 and I2 and the projector lenses P1 and P2 are represented by $I_{I1}$, $I_{I2}$, $I_{P1}$ and $I_{P2}$, respectively, the total rotation angle is given by the expression:

$$\alpha\{K-(I_{I1}+I_{I2})+(I_{P1}+I_{P2})\}$$

where $\alpha$ represents a proportional constant and K represents the excitation current for the objective lens which is also constant as mentioned above. It will thus be appreciated that, in order to prevent the specimen image from being rotated regardless of changes in the magnification, the difference between the sum of the excitation currents for the intermediate lenses (i.e. $I_{I1}+I_{I2}$) and the sum of the excitation currents for the projector lenses (i.e. $I_{P1}+I_{P2}$) has to be constant.

So far as the above condition is satisfied, no rotation of the specimen image occurs independently of changes in the magnification. However, since the objective lens Obj also plays an influential part in the rotation of the specimen image, there arises an angular deviation corresponding to the angle $\phi_1$ in the final specimen image to be observed relative to the actual orientation of the specimens. When this angular deviation is also to be cancelled, the excitation currents for the various lenses must be so selected that the following relation is met. That is, $$(I_{I1}+I_{I2})-(I_{P1}+I_{P2})=K$$

To state this in another way, the difference between the excitation currents supplied to the paired intermediate lenses and the paired projector lenses, respectively, for cancelling the image distortions should be selected to be a constant value which can cancel the rotation of image brought about by the objective lens. Typical examples of the excitation currents for the individual lenses thus determined are illustrated in FIG. 4. These lens excitation currents are selected at respective values at which not only the image distortions mentioned hereinbefore can be cancelled but also the rotations of the specimen image are positively prevented.

Next, description will be made as to compensation of the image inversion occurring upon change-over of magnification from the small or low magnification range to a large or high magnification range. In the case of the electron microscope operating in the low magnification range shown in FIG. 2, the lenses serving as the magnifying elements are only three, that is, the objective lens Obj, the second intermediate lens I2 and the second projector lens P2. Accordingly, the specimen image undergoes inversion three times, as a result of which the orientation of the final specimen image SI5 for observation is inverted or reversed relative to the direction in which the specimen S is oriented.

FIG. 3 shows the lens system changed over to the high magnification mode which differs from the above mentioned low magnification mode in that both the first intermediate lens I1 and the first projector lens P1 are also thrown in as the magnifying elements so that all the lenses of five stages function as the magnifying elements or the magnifying optic system. In that case, correction of the distortions cannot be performed. However, considering the fact that only the central portion of the electron lens is of concern in the case of the examination at great magnifications, adverse influence of the distortions can be neglected. When the excitation currents for the intermediate lenses and the projector lenses are varied in the manner shown in FIG. 4 with the difference in the excitation current between the intermediate and the projector lenses being maintained to be constant, the rotation of the image can be corrected. Further, the image is subjected to inversion under the action of all the imaging lenses provided in five stages, when both the first intermediate lens I1 and the first projector lens P1 are also changed over to the magnifying mode. More particularly, the image is rotated five times, whereby the final specimen image SI5' to be studied is inverted or reversed in the orientation with respect to that of the specimen S. In other words, the final specimen image produced at a high magnification lies in the same orientation as the final image produced at a low magnification. Accordingly, no inversion occurs in the orientation of the final image even when the magnification is changed over from the low magnification range of the high magnification range. The condition on which the first intermediate lens I1 serves as the magnifying element is fulfilled with such an arrangement in which the specimen image SI1' formed by the objective lens Obj is caused to fall on a plane lying between the objective lens Obj and the first intermediate lens I1. Usually, the distance between the objective lens and the specimen S is about 2 mm. When the focal length of the objective lens Obj is selected slightly smaller than this distance, the position onto which the specimen image SI1 or SI1' is focussed can be easily changed so that it lies in front of or behind the first intermediate lens I1, by varying the excitation current by only a small bit.

Figure 5:
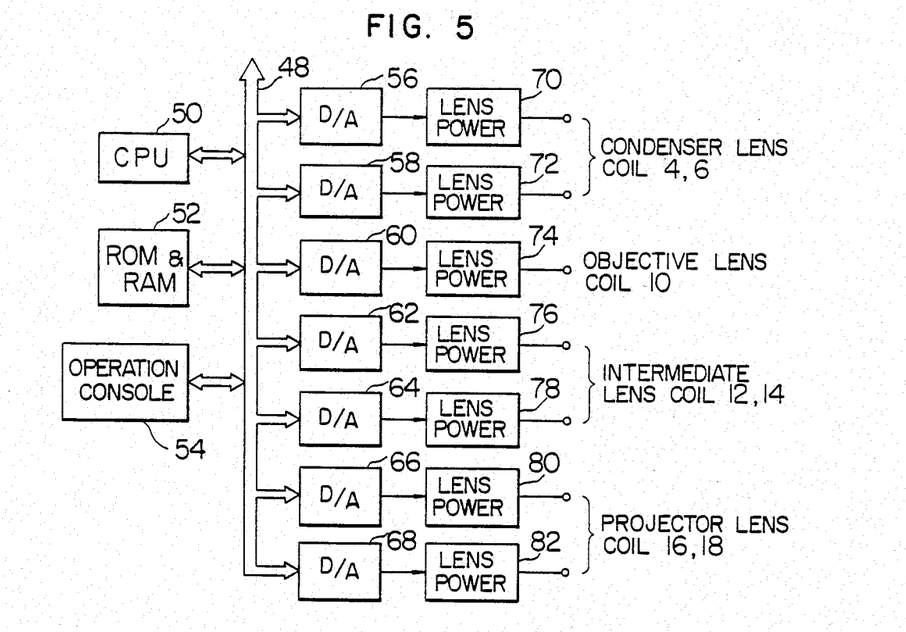
FIG. 5 shows in a schematic block diagram an exemplary arrangement of an excitation current control circuit employed for carrying out the invention.

FIG. 5 shows in a block diagram a typical arrangement of the excitation current control system including the excitation current supply source 24 and the magnification changer 26. A central processing unit (CPU) 50, a memory equipment 52 including ROM and RAM and an operation console 54 including a keyboard are connected to a data bus 40. Digital-to-analogue (D/A) converters 56, 58 . . . , 68 corresponding to the individual lens coils, respectively, are connected to the data bus 48 for receiving required data. Lens current supply circuits 70, 72, . . . , 82 are provided for supplying the excitation currents to the lens coils in response to the analog outputs from the D/A converters.

Operation of the excitation current control system of the arrangement mentioned above is briefly described below. The excitation currents of the individual lenses corresponding to selected magnifications shown in FIG. 4 are previously stored in the ROM of the memory equipment 50. When a desired magnification is inputted through the operation console 54, the CPU 50 reads out the values of the excitation currents corresponding to the inputted magnification from the ROM 52 and controls on the basis of the read-out data the excitation current supply circuits 74, 76, . . . , 82 through the D/A converters 60, 62, . . . , 68 corresponding to the imaging lenses of five stages, respectively, whereby the proper excitation currents are supplied to the lens coils 10, 12, 14, 16 and 18 from the respective current sources 74, 76, 78, 80, and 82. It is mentioned here that the concept of the present invention is embodied in a transmission electron microscope "Ultra High Resolution Analytical Electron Microscope H -800" manufactured by the present assignee. It will now be appreciated from the foregoing that the transmission electron microscope in which the individual lenses of the five-stage lens system are divided into three groups and excited so as to satisfy the predetermined conditions according to the disclosed teaching of the invention allows such distortions to be corrected which would otherwise occur in a low magnification range and can prevent rotation of the image from occurring even upon variation of the magnification, while suppressing the inversion of the image which would otherwise be brought about upon changing-over of the magnification from a low magnification range to a high magnification range.

In the foregoing, it has been assumed that the electron microscope in concern comprises a five-stage lens system. However, this is only by way of exemplary illustration and the invention is never limited to such structure. Further, additional stage or stages of electron lens may be incorporated to attain a further increased magnification.

We claim:

1. An electron microscope, comprising:
   means for emitting an electron beam along a beam axis and for irradiating a specimen on said beam axis with said electron beam so that said electron beam is transmitted through said specimen;

an electron lens system having means for magnifying said transmitted electron beam, said lens system being disposed along said beam axis and including a first electron lens, a first electron lens group constituted by at least two electron lenses of the same polarity which is opposite from the polarity of said first electron lens, and a second electron lens group constituted by at least two electron lenses of a same polarity as said first electron lens which is opposite to that of said first electron lens group; and lens current control means for controlling the excitation currents supplied to said first and said second electron lens groups so that given lens members belonging to said first and second electron lens groups, respectively, serve as reduction lenses in a range of low magnifications, and the lenses of said first and second electron lens groups as a whole operate as a magnifying lens system in a range of high magnifications, said lens current control means including means for controlling said excitation currents in such a manner that the difference between the excitation currents supplied to said first and second electron lens group is maintained substantially constant when the magnification of the microscope is changed, whereby image and rotational distortions in the image produced by the electron beam transmitted through said specimen are compensated over a wide range of magnifications.

2. An electron microscope according to claim 1, wherein said lens current control means comprises means for controlling said excitation currents so that the sum of the excitation currents supplied to said first and second electron len groups is of magnitude which cancels out the rotation of the image of the specimen brought about by said first electron lens.

3. An electron microscope according to claim 1, wherein said lens members which serve as reduction lenses in said first and second electron lens groups, respectively, in said low magnification range are arranged to exhibit barrel distortion, respectively, while the other lenses of said electron lens groups exhibit pincushion distortion, respectively, whereby distortions of the specimen image are corrected at each of said first and second electron lens groups.

4. An electron microscope according to claim 1 or 2, wherein said lens current control means includes memory means for storing command data of the excitation currents of the individual lenses corresponding to given magnifications, entry means for designating a desired mangification, and means including a central processing unit for reading out from said memory means predetermined values of said excitation currents corresponding to said desired magnification in response to the operation of said entry means and for controlling corresponding excitation current supply sources provided for supplying the excitation currents to said electron lenses, respectively.

5. An electron microscope according to claim 1 or 2, wherein said lens current control means includes means for controlling the focal length of said first electron lens so that said focal length is made shorter than the distance between said first electron lens and said specimen by varying said excitation current supplied to said first electron lens by a small degree when the operation mode of said electron microscope is changed over from said low magnification range to a said high magnification range.

6. A transmission electron microscope comprising beam emitting and irradiating means for emitting an electron beam along a beam axis and for irradiating a specimen with said electron beam so that it is transmitted through said specimen; an imaging lens system including a plurality of electron lens means positioned along said beam axis for expanding the transmitted electron beam; lens current control means for controlling excitation currents supplied to said electron lens means of said electron lens system for forming a plurality of electron lenses respectively, in such a way that image and rotational distortions in the image produced by the electron beam transmitted through said specimen are compensated over a wide range of magnifications; and means for providing an imaging plane for the output of said imaging electron lens system;

said imaging electron lens system comprising first electron lens means for forming an objective lens, a first pair of second and third electron lens means forming intermediate lenses and a second pair of fourth and fifth electron lens means forming projector lenses disposed along said beam axis; and said lens current control means including means for controlling the excitation currents supplied to said electron lens means, respectively, in such a manner that (a) said second and fourth electron lens means serve as reduction lenses in a predetermined range of low magnifications, while said first and second pairs of electron lens means together constitute a magnifying lens system in a predetermined range of high magnifications, (b) the difference between the excitation current supplied to said first and second pairs of electron lens means is maintained substantially constant, when said magnification in the microscope is changed, and (c) said first, fourth and fifth electron lens means are supplied with excitation currents of a polarity different from that of the excitation currents supplied to said second and third electron lens means.

7. An electron microscope according to claim 6, wherein said lens current control means includes a computer-controlled magnification changer and lens current setting means for storing values of the excitation currents supplied to said respective lens means in correspondence with respective magnifications and for producing the excitation currents corresponding to a designated one of said magnifications under command of said magnification changer.

8. An electron microscope according to claim 6 or 7, wherein said beam emitting and irradiating means includes condenser lens means connected to receive excitation currents from said lens current control means.

9. An electron microscope according to claim 6 or 7, wherein said lens current control means comprises means for controlling the polarity of the excitation currents supplied to said first to fifth electron lens means, respectively.

10. An electron microscope according to claim 6 or 7, wherein said lens current control means comprises means for controlling said excitation currents supplied to said electron lens means, respectively, in such a manner that the sum of the excitation currents supplied to said first and second pairs of electron lens means, respectively, is of a magnitude to cancel rotation of the specimen image brought about by said first electron lens means.

11. A method of operating a transmission electron beam including a lens system having at least five lens stages so that image and rotational distortions in an image produced when the electron beam is transmitted through a specimen are compensated over a wide range of magnifications, comprising the steps of:
(a) providing second, third, fourth and fifth electron lenses linearly arrayed in alignment from a first electron lens serving as an objective lens toward a final image plane so as to form a first lens group including said second and third electron lenses and a second lens group including said fourth and fifth lenses;
(b) applying excitation currents to said first electron lens, said first lens group and said second lens group with alternately different polarities;
(c) supplying the excitation currents in such a manner that said second electron lens and said fourth electron lens belonging to said first and second lens groups, respectively, serve as reduction lens means in a range of low magnifications, and
(d) varying the excitation currents in such a manner that the difference between the excitation currents supplied to said first lens group and the excitation currents supplied to said second lens group is maintained substantially constant when the magnification is varied.

12. A method according to claim 11, further comprising the step of effecting a small variation in the excitation current supplied to said first electron lens when the operation of said electron microscope is changed over from the range of low magnifications to a range of high magnifications, to thereby make the focal length of said first electron lens shorter than the distance between said first electron lens and a specimen under examination.

13. An electron microscope, comprising:
(a) means for emitting an electron beam along an axis and for irradiating a specimen with the electron beam so that the electron beam is transmitted through the specimen;
(b) an electron lens system for magnifying the transmitted electron beam, the electron lens system including an objective lens and a plurality of electron lens groups arranged along the axis of the transmitted electron beam, each of the plurality of the electron lens groups including a plurality of electron lenses;
(c) a screen on which the magnified transmitted electron beam is so projected as to form an enlarged image on the screen;
(d) means for exciting the electron lens system so that, in a first range of magnification, a preselected lens of the plurality of electron lenses in each of the plurality of electron lens groups is of a barrel distortion type and the remaining lens thereof in each group is of a pincushion distortion type whereby each of the plurality of electron lens groups is of a substantially distortion-free type, and, in a second range of magnification higher than the first range of magnification, the plurality of electron lenses in each of the plurality of electron lens groups are of a pincushion distortion type, and the difference between rotation angles of the image produced by the objective lens and the plurality of the electron lens groups is maintained substantially constant in the first and second ranges of magnification.

14. An electron microscope according to claim 13, wherein the number of pincushion lenses forming magnifying lenses in said electron lens system is one of even and odd both in the first and second ranges of magnification, so that the image on the screen is substantially inversion-free upon change-over from one of the first and the second ranges of magnification to the other thereof.

15. An electron microscope according to claim 13, wherein the means for exciting the electron lens system includes means for applying excitation currents to the electron lenses of said electron lens groups so that the sum of the excitation currents supplied to said electron lens groups is of a magnitude which cancels out the rotation of the image of the specimen brought about by said objective lens.

16. An electron microscope according to claim 15, wherein said excitation current applying means comprises memory means for storing command date of the excitation currents of the individual lenses corresponding to given magnifications, entry means for designating a desired magnification, and means including a central processing unit for reading out from said memory means predetermined values of said excitation currents corresponding to said desired magnification in response to the operation of said entry means and for controlling corresponding excitation current supply sources provided for supplying the excitation currents to said electron lenses, respectively.

17. An electron microscope according to claim 15, wherein said means for exciting the electron lens system comprises means for controlling the focal length of said objective lens so that said focal length is made shorter than the distance between said objective lens and said specimen by varying the excitation current supplied to said objective lens by a small degree when the operation made is changed over from said low magnification range to said high magnification range.

18. An electron microscope according to claim 15, wherein said excitation current applying means comprises computer-controlled magnification changes and lens current setting means for storing values of the excitation currents supplied to the respective electron lenses in correspondence with respective magnifications and for producing the excitation currents corresponding to a designated one of said magnifications under command of said magnification changes.

19. An electron microscope according to claim 18, wherein said beam emitting and irradiating means includes condenser lens means connected to receive excitation currents from said excitation current applying means.

20. An electron microscope according to claim 15, wherein said means for excitaing the electron lens system comprises means for controlling the polarity of the excitation currents supplied to said electron lenses so that at least one electron lens in at least one of said electron lens groups has a polarity opposite that of the objective lens.

21. A method of operating a transmission electron microscope, comprising the steps of:
(a) emitting an electron beam and irradiating a specimen with the electron beam so that the electron beam is transmitted through the specimen;
(b) magnifying the transmitted electron beam by means of an electron lens system including an objective lens and a plurality of electron lens groups arranged along the axis of the transmitted electron beam, each of the plurality of the electron lens groups including a plurality of electron lenses;

(c) projecting the magnified transmitted electron beam on a screen so as to form an enlarged image on the screen;

(d) exciting the electron lens system so that in a first range of magnification a preselected lens of the plurality of electron lenses in each of the plurality of electron lens groups is of a barrel distortion type and the remaining lens thereof is of a pincushion distortion type whereby each of the plurality of electron lens groups is of a substantially distortion-free type, and in a second range of magnification higher than the first range of magnification, the plurality of electron lenses in each of the plurality of electron lens groups are all of a pincushion distortion type, and (e) maintaining the difference between the rotation angles of image produced by the objective lens and the plurality of electron lens groups substantially constant in the first and second ranges of magnification by controlling the magnitudes of said excitation currents applied to said electron lens groups.

* * * * *